US007070902B2

(12) United States Patent
Mulligan et al.

(10) Patent No.: US 7,070,902 B2
(45) Date of Patent: Jul. 4, 2006

(54) IMAGEABLE ELEMENTS CONTAINING CYANOACRYLATE POLYMER PARTICLES

(75) Inventors: James Mulligan, Fort Collins, CO (US); Kevin B. Ray, Fort Collins, CO (US); Kevin D. Wieland, Greeley, CO (US); Eric Clark, Loveland, CO (US)

(73) Assignee: Eastman Kodak Company, Rochester, NY (US)

( * ) Notice: Subject to any disclaimer, the term of this patent is extended or adjusted under 35 U.S.C. 154(b) by 316 days.

(21) Appl. No.: 10/648,672

(22) Filed: Aug. 26, 2003

(65) Prior Publication Data

US 2005/0048396 A1 Mar. 3, 2005

(51) Int. Cl.
*G03F 7/34* (2006.01)
*G03F 7/11* (2006.01)
*G03F 7/39* (2006.01)

(52) U.S. Cl. ....................... 430/200; 430/201; 430/964

(58) Field of Classification Search ................ 430/200, 430/201, 964
See application file for complete search history.

(56) References Cited

U.S. PATENT DOCUMENTS 3,945,318 A 3/1976 Landsman
3,962,513 A 6/1976 Eames
3,964,389 A 6/1976 Peterson
4,626,493 A 12/1986 Butters et al.
5,460,918 A 10/1995 Ali et al.
5,605,780 A 2/1997 Burberry et al.
5,712,079 A * 1/1998 Robello et al. .......... 430/270.1
5,819,661 A 10/1998 Lewis et al.
5,858,607 A 1/1999 Burberry et al.
5,998,088 A * 12/1999 Robello et al. ............. 430/269
6,051,531 A 4/2000 Noonan et al.
6,197,474 B1 3/2001 Niemeyer et al.
6,447,884 B1 9/2002 Burberry et al.
6,461,793 B1 10/2002 Chang et al.
6,762,006 B1 * 7/2004 Purbrick et al. ............ 430/201
6,924,080 B1 * 8/2005 Mulligan et al. ........ 430/270.1
2003/0138723 A1 7/2003 Purbrick et al.

FOREIGN PATENT DOCUMENTS

WO WO 97/20252 6/1997

* cited by examiner

*Primary Examiner*—Richard L. Schilling
(74) *Attorney, Agent, or Firm*—James L. Tucker

(57) ABSTRACT

Assemblages that comprise a donor element and a receptor are disclosed. The donor element comprises a binder and particles of a cyanoacrylate polymer. The assemblages can be thermally imaged to form lithographic printing plates.

20 Claims, No Drawings

IMAGEABLE ELEMENTS CONTAINING CYANOACRYLATE POLYMER PARTICLES

FIELD OF THE INVENTION

The invention relates to lithographic printing. In particular, this invention relates to assemblages that comprise a binder and particles of a cyanoacrylate polymer that can be imaged to form lithographic printing plates.

BACKGROUND OF THE INVENTION

In conventional or "wet" lithographic printing, ink receptive regions, known as image areas, are generated on a hydrophilic surface. When the surface is moistened with an aqueous medium, typically a fountain solution, and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plate precursors typically comprise an imageable layer applied over the hydrophilic surface of a substrate. The imageable layer includes one or more radiation-sensitive components, which may be dispersed in a suitable binder. Alternatively, the radiation-sensitive component can also be the binder material. Following imaging, either the imaged regions or the unimaged regions of the imageable layer are removed by a suitable developer, revealing the underlying hydrophilic surface of the substrate. If the imaged regions are removed, the precursor is positive-working. Conversely, if the unimaged regions are removed, the precursor is negative-working. In each instance, the regions of the imageable layer (i.e., the image areas) that remain are ink-receptive, and the regions of the hydrophilic surface revealed by the developing process accept water and aqueous solutions, typically a fountain solution, and repel ink.

The developers used to develop imaged imageable elements are typically aqueous alkaline solutions, which may contain substantial amounts of organic solvents. Disposal of substantial quantities of developer is expensive and can cause environmental problems. Thus, systems have been developed that do not require a developer.

Direct digital imaging, which obviates the need for imaging through a mask, is becoming increasingly important in the printing industry. Imageable systems for the preparation of lithographic printing plates have been developed for use with lasers. Burberry, U.S. Pat. No. 5,858,607, incorporated herein by reference, discloses an assemblage comprising a receptor with a hydrophilic surface, and a donor support comprising a layer of a cyanoacrylate polymer. These systems do not require a developer. When the assemblage is exposed with a high intensity laser beam, the cyanoacrylate polymer is transferred to the hydrophilic surface of the receptor to produce a lithographic printing plate.

In the preparation of these systems, the cyanoacrylate polymer is dissolved in a coating solvent and the resulting coating solution coated over the donor support to form the layer of the cyanoacrylate polymer. Typical coating solvents are acetonitrile, and halogenated organic solvents such as dichloromethane, chloroform, and methyl chloroform, which are toxic, and must be recovered in the coating operation. Thus, a need exists for a digitally imageable, processless imageable assemblage that does not require the use of toxic organic solvents in its preparation.

SUMMARY OF THE INVENTION

The invention is an assemblage comprising:

a donor element comprising:

a donor support, a donor layer over the donor support, and a photothermal conversion material; and a receptor;

in which:

the donor layer comprises a binder and particles of a cyanoacrylate polymer;

the donor layer is in face to face contact with the receptor; and either the donor support or the receptor transmits infrared or near infrared radiation.

In another aspect, the invention is a method for forming an image by thermally imaging the assemblage and separating the receptor and the donor support.

DETAILED DESCRIPTION OF THE INVENTION

Unless the context indicates otherwise, in the specification and claims, the terms binder, cyanoacrylate polymer, particles of a cyanoacrylate polymer, photothermal conversion material, coating solvent, and similar terms also include mixtures of such materials. Unless otherwise specified, all percentages are percentages by weight. Thermal imaging refers to imaging with a hot body, such as a thermal head, or with infrared radiation.

The assemblage comprises a donor element and a receptor. The donor element comprises a donor layer, which is in face to face contact with a hydrophilic surface of the receptor.

Donor Element

The donor element comprises a donor layer, optionally an absorber layer, and a donor support. The donor element also comprises an infrared absorber generally known as a photothermal conversion material, which may be present in donor layer and/or in the absorber layer. Preferably, the donor layer comprises the photothermal conversion material.

Donor Support

The donor support may be any material that is dimensionally stable and can withstand the heat of imaging. When imaging is to be carried out though the donor support, the donor support must transmit the radiation used for imaging, typically infrared or near infrared radiation.

Useful materials include polyesters; polyamides; polycarbonates, such as bisphenol A polycarbonate; cellulose esters such as cellulose acetate and cellulose acetate butyrate; fluoropolymers such as poly(vinylidene fluoride) and poly (tetrafluoroethylene-co-hexafluoropropylene); polyethers such as polyoxymethylene; polyacetals; polyolefins such as polystyrene, polyethylene, polypropylene and methylpentene polymers; and polyimides such as polyimide-amides and polyether-imides. Preferred materials are polyesters, especially poly(ethylene terephthalate) and poly(ethylene naphthanate). The donor support may also comprise a subbing layer over the surface of the donor support adjacent to the donor layer and an antihalation layer on either or both surfaces of the donor support. The donor support typically has a thickness of about 5 to about 250 microns, more typically about 50 to about 200 microns.

Donor Layer

The donor layer comprises particles of a cyanoacrylate polymer and a binder. The donor layer preferably also comprises a photothermal conversion material.

Cyanoacrylate polymers have many beneficial properties when used in lithographic printing plates, including relatively low decomposition, typically below 200° C.; good ink affinity; excellent adhesion to the surface of the receptor, especially to anodized aluminum; good resistance to common pressroom chemicals; and high wear resistance. Useful cyanoacrylate polymers for the donor layer include homopolymers of cyanoacrylate monomers and copolymers of two or more cyanoacrylate monomers. Typical cyanoacrylate monomers include alkyl-2-cyanoacrylates, such as methyl-2-cyanoacrylate, ethyl-2-cyanoacrylate, n-propyl-2-cyanoacrylate, and n-butyl-2-cyanoacrylate; and alkoxyalkyl-2-cyanoacrylates, such as methoxyethyl-2-cyanoacrylate and ethoxyethyl cyanoacrylate. Commercially available monomers include LOCTITE® 85 (80% methyl-2-cyanoacrylate and 20% ethyl-2-cyanoacrylate), LOCTITE® 493 (methyl-2-cyanoacrylate) and LOCTITES® 420 (ethyl-2-cyanoacrylate), all of which are available from Loctite, Rocky Hill, Conn., USA. Cyanoacrylate monomers are also available from the PERMABOND Division of National Starch & Chemical, Bridgewater, N.J., USA.

Typical cyanoacrylate polymers are poly(methyl-2-cyanoacrylate), (methyl-2-cyanoacrylate/ethyl-2-cyanoacrylate) copolymer, poly(ethoxy-2-ethyl cyanoacrylate), poly (methoxy-2-ethyl cyanoacrylate), (ethoxy-2-ethyl cyanoacrylate/methoxy-2-ethyl cyanoacrylate) copolymer, (ethyl-2-cyanoacrylate/ethoxy-2-ethyl cyanoacrylate) copolymer, (methyl-2-cyanoacrylate/methoxy-2-ethyl cyanoacrylate) copolymer, (ethyl cyanoacrylate/methoxy-2-ethyl cyanoacrylate) copolymer, (methyl cyanoacrylate/ethoxy-2-ethyl cyanoacrylate) copolymer, poly(ethyl-2-cyanoacrylate), poly(n-propyl-2-cyanoacrylate), and poly(n-butyl-2-cyanoacrylate).

The particles of a cyanoacrylate polymer may be prepared by conventional polymerization techniques. For example, polymerization may be initiated by combining suitable cyanoacrylate monomers with water, glacial acetic acid, and a surfactant, such as benzene dodecyl sulfonate or sodium lauryl sulfate, to form a latex. Particle size may be varied, for example, by altering the amount of surfactant added to the reaction mixture, or by varying the amount of heating applied to the reaction mixture during polymerization. Optionally, high shear stirring may be applied to the reaction mixture to control particle size.

The particles are not spherical. They typically have a major dimension between about 50 nm and about 500 nm, more particularly between about 50 nm and about 400 nm. The particles have a mean major dimension of not greater than 350 nm. The donor layer may include some particles outside of these size ranges as long as the properties of the assemblage are not adversely affected. However, if more than a few particles have a major dimension above about 500 nm, the donor layer may tend to be discontinuous, which may be detrimental to image quality.

The binder can be hydrophilic or hydrophobic. Hydrophilic binders include, for example, poly(vinyl pyrrolidone), poly(vinyl alcohol), polyethyleneimine, poly(ethyloxazoline), polyacrylamide, gelatin, polyacrylic acid, polyvinylimidazole, starches, dextrin, amylogen, gum arabic, agar, algin, carrageenan, fucoidan, laminarin, corn hull gum, gum ghatti, karaya gum, locust bean gum, pectin, guar gum, hydroxypropylcellulose, hydroxyethylcellulose, hydroxypropylmethylcellulose, and carboxymethyl cellulose. Hydrophobic binders include polyvinyl pyrrolidone/vinyl acetate copolymers, and polyvinyl pyrrolidone/vinylcaprolactam copolymers. The preferred binders are poly(vinyl pyrrolidone) and polyvinyl pyrrolidone/vinyl acetate copolymers.

Absorber Layer

The donor element may also comprise an absorber layer between the donor support and the donor layer. The absorber layer preferably consists essentially of the photothermal conversion material and, optionally, a surfactant. It may be possible to use less of the photothermal conversion material if it is present in a separate absorber layer. The absorber layer preferably has a thickness sufficient to absorb at least 90%, preferably at least 99%, of the imaging radiation. Typically, the absorber layer has a coating weight of about 0.02 $g/m^2$ to about 2 $g/m^2$, preferably about 0.05 $g/m^2$ to about 1.5 $g/m^2$. Elements that comprise an absorber layer are disclosed in Shimazu, U.S. Pat. No. 6,593,055, the disclosure of which is incorporated herein by reference.

Photothermal Conversion Material

Imageable elements that are to be imaged with infrared radiation typically comprise an infrared absorber, known as a photothermal conversion material. Photothermal conversion materials absorb radiation and convert it to heat. Although a photothermal conversion material is not necessary for imaging with a hot body, imageable elements that contain a photothermal conversion material may also be imaged with a hot body, such as a thermal head or an array of thermal heads.

The photothermal conversion material may be any material that can absorb radiation and convert it to heat. Suitable materials include, for example, dyes and pigments. Suitable pigments include, for example, carbon black, Heliogen Green, Nigrosine Base, iron(III) oxide, manganese oxide, Prussian Blue, and Paris blue. Because of its low cost and wide absorption bands that allow it to be used with imaging devices having a wide range of peak emission wavelengths, one particularly useful pigment is carbon black. The size of the pigment particles should not be more than the thickness of the layer that contains the pigment. Preferably, the size of the particles will be half the thickness of the layer or less.

The photothermal conversion material may be a dye with the appropriate absorption spectrum. Dyes, especially dyes with a high extinction coefficient in the range of 750 nm to 1200 nm, are preferred. Examples of suitable dyes include dyes of the following classes: methine, polymethine, arylmethine, cyanine, hemicyanine, streptocyanine, squarylium, pyrylium, oxonol, naphthoquinone, anthraquinone, porphyrin, azo, croconium, triarylamine, thiazolium, indolium, oxazolium, indocyanine, indotricarbocyanine, oxatricarbocyanine, phthalocyanine, thiocyanine, thiatricarbocyanine, merocyanine, cryptocyanine, naphthalocyanine, polyaniline, polypyrrole, polythiophene, chalcogenopyryloarylidene and bis(chalcogenopyrylo)polymethine, oxyindolizine, pyrazoline azo, and oxazine classes. Absorbing dyes are disclosed in numerous publications, for example, Nagasaka, E P 0,823,327; DeBoer, U.S. Pat. No.4, 973,572; Jandrue, U.S. Pat. No. 5,244,771; and Chapman, U.S. Pat. No. 5,401,618. Examples of useful absorbing dyes include: ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectraIR 830A and SpectraIR 840A (Spectra Colors), and IR Dye A, IR Dye B, IR Dye C, and IR Dye D, whose structures are shown below:

Other useful photothermal conversion materials include Cyan Dye-1 and Cyan Dye-2, disclosed in columns 7 and 8 of Burberry, U.S. Pat. No. 5,858,607, incorporated herein by reference.

The photothermal conversion material may be applied to the donor support as a dispersion, or may be thoroughly dissolved. When the dye is applied as a dispersion, the dye preferably has a particle size of less than about 25 nm, more preferably about 10 nm to 20 nm.

IR Dye A

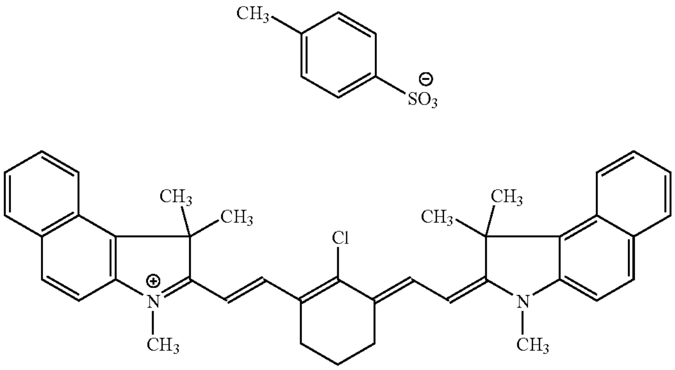

IR Dye B

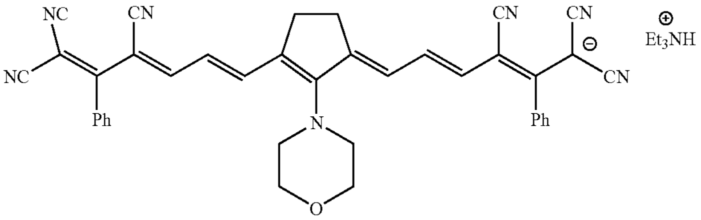

IR Dye C

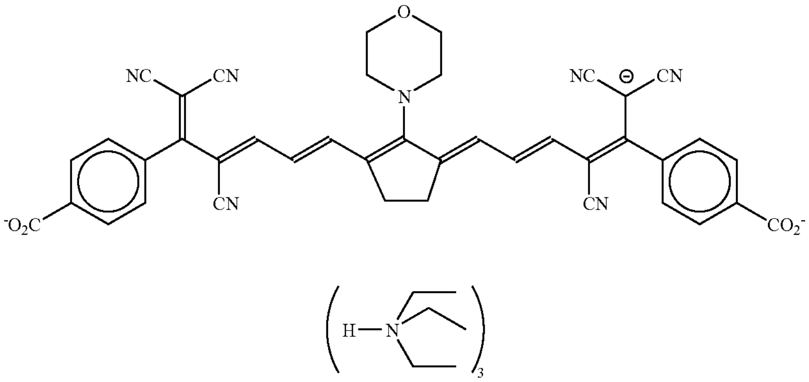

IR Dye D

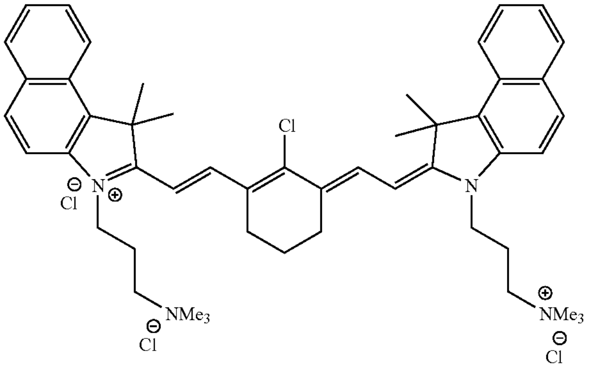

Composition

When the photothermal conversion material is in the donor layer and no absorber layer is present, the donor layer typically comprises about 1 wt % to about 25 wt %, especially about 7 wt % to about 20 wt %, more especially about 10 wt % to about 16 wt % of the photothermal conversion material; about 5 wt % to about 20 wt %, especially about 10 wt % to about 18 wt % of the binder; and about 60 wt % to about 90 wt %, especially about 65 wt % to about 85 wt % of the cyanoacrylate polymer particles.

The photothermal conversion material is typically present in an amount to provide a dry weight ratio to the particles of the cyanoacrylate polymer of from about 0.02:1 to about 0.8:1. A good level of operation is seen when the dry weight ratio of photothermal conversion material to cyanoacrylate particle is around 0.25:1. The amount of infrared absorbing compound is generally sufficient to provide an optical density of at least 0.05, and preferably, an optical density of from about 0.5 to about 2 at the imaging wavelength. As is well known to those skilled in the art, the amount of compound required to produce a particular optical density can be determined from the thickness of the layer and the extinction coefficient of the infrared absorbing compound at the wavelength used for imaging using Beer's law.

The donor layer preferably comprises a dispersion of at least 0.05 $g/m^2$ of the cyanoacrylate polymer particles. Dispersions that contain about 2 $g/m^2$ of the cyanoacrylate polymer particles work well, and higher levels are feasible. Typically, the donor layer has a coating weight of about 0.5 to about 4 $g/m^2$, preferably 0.6 to 2.5 $g/m^2$.

Receptor

The receptor comprises a support, which may be any material conventionally used as the support for a lithographic printing plate. When the assemblage is to be imaged through the receptor, the receptor must be transparent to the imaging radiation. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Typically, polymeric films contain a sub-coating on one or both surfaces to modify the surface characteristics to enhance the hydrophilicity of the surface, to improve adhesion to subsequent layers, to improve planarity of paper support, and the like. The nature of this layer or layers depends upon the support and the composition of the subsequent layers. Examples of subbing layer materials are adhesion-promoting materials, such as alkoxysilanes, aminopropyltriethoxysilane, glycidoxypropyltriethoxysilane and epoxy functional polymers, as well as conventional subbing materials used on polyester bases in photographic films.

The surface of an aluminum support may be treated by techniques known in the art, including physical graining, electrochemical graining, chemical graining, and anodizing. The receptor should be of sufficient thickness to sustain the wear from printing and be thin enough to wrap around a printing form, typically from about 100 μm to about 600 μm. The receptor may comprise a layer over the aluminum support. This layer may be formed by treatment of the support with, for example, silicate, dextrine, hexafluorosilicic acid, phosphate/fluoride, polyvinyl phosphonic acid (PVPA) or vinyl phosphonic acid copolymers.

The back side of the receptor (i.e., the side opposite the hydrophilic surface) may be coated with an antistatic agent and/or a slipping layer or matte layer to improve handling and "feel" of the assemblage.

Preparation of the Assemblage

The donor element may be prepared by applying the donor layer to the donor support using conventional techniques. The donor layer is then placed in face-to-face contact with the receptor to form the assemblage.

The terms "solvent" and "coating solvent" include mixtures of solvents. These terms are used although some or all of the materials may be suspended or dispersed in the solvent rather than in solution. Selection of coating solvents depends on the nature of the components present in the various layers.

The donor layer may be applied by any conventional method, such as coating or lamination. Typically the ingredients are dispersed and dissolved in a suitable coating solvent, and the resulting mixture coated by conventional methods, such as spin coating, bar coating, gravure coating, die coating, or roller coating.

A solvent that does not dissolve the particles of the cyanoacrylate polymer must be used. Thus, solvents that would dissolve the particles of the cyanoacrylate polymer, such as acetonitrile, and halogenated organic solvents such as dichloromethane, chloroform, and methyl chloroform, which are toxic and must be recovered from the coating process, are not used as coating solvents. This reduces the investment that must be made in equipment and eliminates the possibility of exposure to toxic chemicals. When the photothermal conversion material is a dye, it may be either dissolved in the coating solvent or dispersed in the coating solvent.

A preferred coating solvent is ethyl acetate regardless of the binder. For compositions that comprise the particles of the cyanoacrylate polymer, polyvinyl pyrrolidone binder, and a photothermal conversion material, a solvent system of ethyl acetate and 1-propanol may be used. Other useful solvents include water; organic solvents that are miscible or highly soluble in water, such as methanol, ethanol, 2-propanol, 1-methoxy-2-propanol, and 1-propanol; and mixtures thereof.

Following coating, the resulting donor element is dried. The element may be dried by, for example, air drying or drying in an oven at about 65° C. The donor layer on the donor support is then placed in face-to-face contact with the hydrophilic surface of the receptor to form the assemblage.

Imaging

Imaging of the assemblage may be carried out by well-known methods. Imaging transfers the cyanoacrylate polymer from the donor layer to the receptor, forming an image on the receptor that corresponds to the imaged regions of the assemblage.

The assemblage may be imaged with a laser or an array of lasers emitting modulated near infrared or infrared radiation in a wavelength region that is absorbed by the photothermal conversion material. Infrared radiation, especially infrared radiation in the range of about 800 nm to about 1200 nm, is typically used for imaging thermally imageable elements. Imaging is conveniently carried out with a laser emitting at about 830 nm, about 1056 nm, or about 1064 nm. Suitable commercially available imaging devices include image setters such as the CREO® Trendsetter (Creo, Burnaby, British Columbia, Canada), the Screen PlateRite model 4300, model 8600, and model 8800 (Screen, Rolling Meadows, Chicago, Ill., USA), and the Gerber Crescent 42T (Gerber).

Typically, imaging is carried out by imaging through a transparent donor support, i.e., the imaging radiation is transmitted by the donor support. However, imaging can be carried out by imaging through a transparent receptor, i.e., the imaging radiation is transmitted by the receptor.

Alternatively, the assemblage may be imaged using a hot body, typically with a conventional apparatus containing a thermal printing head. A suitable imaging apparatus comprises at least one thermal head but would usually include a thermal head array, such as a TDK Model No. LV5416 used in thermal fax machines and sublimation printers, the GS618-400 thermal plotter (Oyo Instruments, Houston, Tex., USA), or the Model VP-3500 thermal printer (Seikosha America, Mahwah, N.J., USA). Heat may be applied to either the donor support or the receptor, but imaging by heating the donor support is preferred.

Following imaging, the receptor is separated from the assemblage and may be used directly as a lithographic printing plate. No further processing is required.

Once the assemblage has been imaged and processed to form a printing plate, printing can be carried out by applying a fountain solution and then a lithographic ink to the image on its surface. Fountain solution is taken up by the surface of the receptor not covered by the transfer of cyanoacrylate polymer, and the ink is taken up by the image formed by the cyanoacrylate polymer. The ink is transferred to a suitable receiving material (such as cloth, paper, metal, glass or plastic) either directly or indirectly using an offset printing blanket to provide a desired impression of the image thereon.

The advantageous properties of this invention can be observed by reference to the following examples, which illustrate but do not limit the invention.

EXAMPLES

In the Examples, "coating solution" refers to the mixture of solvent or solvents and additives coated, even though some of the additives may be in suspension rather than in solution, and "total solids" refers to the total amount of nonvolatile material in the coating solution even though some of the additives may be nonvolatile liquids at ambient temperature. Except where indicated, the indicated percentages or parts are percentages or parts by weight based on the total solids in the coating solution.

| Glossary | |
|---|---|
| Aerosol OT | Bis(2-ethylhexyl)sulfosuccinate surfactant (C. P. Hall, Chicago, IL, U.S.A.) |
| BYK 340 | Polymeric fluorosurfactant in DOWANOL ® DPM (Byk Chemie, Wallingford, CT, U.S.A.) |
| CREO ® Trendsetter 3230 | Commercially available platesetter, using Procom Plus software, operating at a wavelength of 830 nm (Creo Products Inc., of Burnaby, BC, Canada) |
| E-735 | Polyvinyl pyrrolidone vinyl acetate copolymer $(C_6H_9NO.C_4H_8O_2)_x$, 50% solution in ethanol (ISP Technologies, Wayne, NJ, U.S.A.) |
| I-335 | Polyvinyl pyrrolidone vinyl acetate copolymer $(C_6H_9NO.C_4H_8O_2)_x$, 50% solution in isopropyl alcohol (ISP Technologies, Wayne, NJ, U.S.A.) |
| I-535 | Polyvinyl pyrrolidone vinyl acetate copolymer $(C_6H_9NO.C_4H_8O_2)_x$, 50% solution in isopropyl alcohol (ISP Technologies, Wayne, NJ, U.S.A.) |
| IR Dye B | Infrared absorbing dye ($lambda_{max}$ = 818 nm, extinction coefficient in methanol = $1.24 \times 10^5$) (see structure above) (Eastman Kodak, Rochester, NY, U.S.A.) |
| IR Dye C | Infrared absorbing dye ($lambda_{max}$ = 814 nm, extinction coefficient in methanol = $1.42 \times 1^5$) (see structure above) (Eastman Kodak, Rochester, NY, U.S.A.) |
| IR Dye D | Infrared absorbing dye ($lambda_{max}$ = 819 nm, extinction coefficient in methanol = $2.41 \times 10^5$) (see structure above) (Eastman Kodak, Rochester, NY, U.S.A.) |
| LOCTITE ® 85 | 80% methyl 2-cyanoacrylate and 20% ethyl 2-cyanoacrylate (Loctite Corp., Rocky Hill, CT, U.S.A.) |
| PVP K-15 | Polyvinyl pyrolidone, 30% solids in aqueous solution (ISP Technologies, Wayne, NJ, U.S.A.) |
| S-630 | Polyvinyl pyrrolidone vinyl acetate copolymer $(C_6H_9NO.C_4H_8O_2)_x$, solid (ISP Technologies, Wayne, NJ, U.S.A.) |
| Substrate A | 0.3 mm (0.3 gauge), aluminum sheet, electrograined, anodized with sulfuric acid, and post treated with polyvinyl phosphonic |
| ZONYL ® FSN | Fluorosurfactant (DuPont, Wilmington, DE, U.S.A.) |

INDUSTRIAL APPLICABILITY

The assemblages the invention can be used to form lithographic printing plates. The transfer requires relatively low exposure and no post processing is necessary. The improved formulation produces superior press performance having good press latitude, good ink receptivity, clean backgrounds and longer running plates than current thermal transfer plates.

Example 1

This example illustrates image formation using an assemblage in which the donor layer comprises a binder.

A coating solution was prepared comprising a dispersion of the following components in water: 68.9 parts of the cyanoacrylate polymer particles prepared in Example 4; 14.1 parts of IR dye B; 16.5 parts of PVP K-15; and 0.5 parts of ZONYL® FSN. Both the particles of the cyanoacrylate polymer and IR dye B were insoluble in the coating solvent and were applied as a dispersion. The coating solution was coated onto about 100 micron thick (4 mil thick) polyethylene terephthalate donor support (Alameda, Anaheim, Calif., USA). Dry coating weight of the resulting donor layer: 1.3 g/m$^2$. Sample A was allowed to air dry. Sample B was dried at 65° C. for 20 sec in a Model DP-1000+ Ranar conveyor oven (Ranar, El Segundo, Calif., USA). Sample C was dried in two passes at 65° C. for 20 sec each through the Ranar conveyor oven.

Each of the three samples, comprising the donor layer on the donor support, was mounted with the donor layer facing the anodized surface of Substrate A as the receptor, with the donor layer in contact with the anodized surface. Each sample was held in place with adhesive vinyl tape. Each of the resulting assemblages was imaged with an internal test pattern through the polyethylene terephthalate donor support with the CREO® Trendsetter 3244× image setter at a laser power of 15 W and imaging energies of 50, 100, 150, 200, 250, 300, and 350 mJ/cm$^2$. The tape was removed and the donor element separated from the receptor. An image had been transferred to the receptor to form a printing plate. The resolution of the printing plates was at least 2–98% at 150 lines per inch. For Sample A, the optimum exposure was 200 mJ/cm$^2$. For Samples B and C, the optimum exposure was 250 mJ/cm$^2$.

Each of the printing plates was mounted on an AB Dick duplicator press (AB Dick, Niles, Ill., USA). The press used Van Son Rubberbase ink and a fountain solution containing about 23.5 ml/L (3 oz per gallon) of Varn 142W and about 23.5 ml/L (3 oz per gallon) of Varn PAR alcohol replacement. Each printing plate printed at least 250 good quality impressions.

Example 2

This example illustrates image formation using an assemblage in which the donor layer comprises a binder.

The procedure of Example 1 was repeated except that an about 50 micron (2 mil) polyethylene terephthalate donor support was used as the receptor and the sample was allowed to air dry at room temperature. Both the particles of the cyanoacrylate polymer and IR dye B were insoluble in the coating solvent and were applied as a dispersion. An assemblage was formed as in Example 1, and the resulting assemblage was imaged with the CREO® Trendsetter at imaging energy densities of 150, 250, and 350 mJ/cm$^2$. The resolution of the resulting printing plate was at least 2–98% at 150 lines per inch. The optimum exposure was 250 mJ/cm$^2$.

Comparative Example 1

This example illustrates image formation using an assemblage in which the donor layer does not comprise a binder.

The procedure of Example 1 was repeated except that the coating solution contained: 82.5 parts of the cyanoacrylate polymer particles prepared in Example 4; 16.9 parts of IR dye B; and 0.6 parts of ZONYL® FSN. The coating solution was coated onto an about 50 micron thick (2 mil thick) polyethylene terephthalate donor support and onto an about 100 micron thick (4 mil thick) polyethylene terephthalate donor support. Both of the resulting donor elements were allowed to air dry. Dry coating weight of the resulting donor layers: 1.2 g/m$^2$.

The donor elements were formed into assemblages and imaged as in Example 1 at imaging energies of 150, 250 and 350 mJ/cm$^2$ with an internal test pattern. During imaging, the images were transferred from the donor support to the receptor. For both donor elements, the optimum imaging energy appeared to be 300 mJ/cm$^2$. A halo of material was deposited on the receptor around the desired image area.

The donor elements and images obtained were inferior to those obtained in Examples 1 and 2. The donor layer, which did not contain a binder, was prone to cracking and flaking away from the donor support. In contrast, the donor layers formed in Examples 1 and 2 were robust films on the polyethylene terephthalate donor support and did not deposit a halo of undesired transferred material.

Example 3

This example illustrates image formation using an assemblage in which the donor layer comprises a binder.

The procedure of Example 1 was repeated except that the coating solution contained: 68.9 parts of the cyanoacrylate polymer particles prepared in Example 4; 14.1 parts of IR dye C; 16.5 parts of PVP K-15; and 0.5 parts of ZONYL® FSN. IR dye C was soluble in the coating solvent. The coating solution was coated onto the about 100 micron thick (4 mil thick) polyethylene terephthalate donor support and allowed to air dry. IR dye C was soluble in the coating solvent, but the particles of the cyanoacrylate polymer were insoluble in the coating solvent and were applied as a dispersion. Dry coating weight of the resulting donor layer: 1.3 g/m$^2$.

A second donor element was prepared by this procedure, except that the coating solution was filtered through a 5 micron paper filter before coating.

An assemblage was formed from each donor element as in Example 1, and the resulting assemblages were imaged with the CREO® Trendsetter at imaging energy densities of 150, 250, and 350 mJ/cm$^2$. The resolution of the resulting printing plate was at least 2–98% at 150 lines per inch. The optimum exposure both assemblages was less than 150 mJ/cm$^2$.

Each of the printing plates was mounted on an AB Dick duplicator press and evaluated as in Example 1. Each printing plate printed at least 250 good quality impressions.

Example 4

This example illustrates preparation of particles of a cyanoacrylate polymer.

Distilled water (1,370 g), glacial acetic acid (0.8 g), and sodium benzene dodecyl sulfonate (1.5 g) were mixed in a 4 L flask. A mixture of LOCTITE® 85 cyanoacrylate monomer (155 g) and glacial acetic acid (0.8 g) was added dropwise over 5 minutes. The reaction mixture became translucent and the reaction was mildly exothermic. The resulting latex was heated at 70 to 75° C. for 10 minutes, cooled to room temperature, and passed through a gauze filter (Great Lakes Filter Media, Detroit, Mich., USA).

Particle size analysis using an ultrafine particle size analyzer (UPA150) (Microtrac, North Largo, Fla., USA) showed a multimodal distribution with major populations at particle diameters of 90 nm and 260 nm. The median particle size was 180 nm. Weight average molecular weight=2,560.

Example 5

A coating solution was prepared comprising a dispersion of the following components in ethyl acetate/n-propyl alcohol (3.1:1): 77.7 parts of the cyanoacrylate polymer particles prepared in Example 17; 7.3 parts of IR dye C; 14.5 parts of PVP K-15; and 0.5 parts of Byk 340. Both the particles of the cyanoacrylate polymer and IR dye were C insoluble in the coating solvent and were applied as a dispersion. The resulting coating solution was coated onto the about 100 micron thick polyethylene terephthalate donor support and the resulting donor element dried at 65° C. for 60 seconds in the Ranar conveyor oven. Dry coating weight of the resulting donor layer: 1.2 g/m$^2$.

An assemblage was formed and imaged as in Example 1. The assemblage was imaged with an internal test pattern on the CREO® Trendsetter (laser power of 15 watts) at imaging energy densities of 150, 250, 350 and 400 mJ/cm$^2$ with an internal test pattern.

The donor element was peeled away from the receptor. The test pattern (pale green in color) had been transferred to the receptor. The resolution was at least 2–98% at 150 lines per inch. The optimum exposure was about 150 mJ/cm$^2$.

The resulting printing plate was mounted on the AB Dick press and evaluated as in Example 1. At least 250 good quality impressions were obtained.

Example 6

Example 5 was repeated, except that the dry coating weight of the donor layer was 0.6 g/m$^2$. The 150 mJ/cm$^2$ image was slightly overexposed, indicating that the optimum exposure was less than 150 mJ/cm$^2$. The resolution was at least 2–98% at 150 lines per inch. The resulting printing plate was mounted on the AB Dick press, and printed at least 250 good quality impressions.

Example 7

Example 5 was repeated, except that the dry coating weight of the donor layer was 2.6 g/m$^2$. The optimum exposure was about 350 mJ/cm$^2$. The resulting printing plate was mounted on the AB Dick press, and printed at least 250 good quality impressions, for the image formed at 350 mJ/cm$^2$. The resolution was at least 2–98% at 150 lines per inch. The images exposed at 150 and 250 mJ/cm$^2$ had insufficient transfer of cyanoacrylate to the receptor, and the areas that had transferred showed premature wearing on the AB Dick press.

Examples 8–11

Coating formulations comprising dispersions of the components listed in Table 1 in ethyl acetate/n-propyl alcohol (3.1:1)) were coated on the about 100 micron polyethylene donor support as in Example 1. The cyanoacrylate polymer particles were prepared as in Example 17. IR Dye D was applied as a dispersion. The resulting donor element was dried at 65° C. for 60 sec in the Ranar conveyor oven. Dry coating weight of the donor layer was 1.5 g/m$^2$.

TABLE 1

| Component | Example 8 | 9 | 10 | 11 |
|---|---|---|---|---|
| | Parts by Weight | | | |
| Particles of cyanoacrylate polymer | 82.2 | 87.2 | 75 | 70 |
| IR Dye D | 7.3 | 7.3 | 10 | 15 |
| PVP K-15 | 10 | 5 | 14.5 | 14.5 |
| BYK 340 | 0.5 | 0.5 | 0.5 | 0.5 |

Assemblages were formed from each donor element as in Example 1. Each assemblage was imaged with an internal test pattern on the CREO® Trendsetter (laser power of 15 watts) at imaging energy densities of 150, 250, 350 and 400 mJ/cm$^2$ with an internal test pattern.

Each donor element was peeled away from its receptor. In each case, the test pattern (pale green in color) had been transferred to the receptor. In each case, the resolution was at least 2–98% at 150 lines per inch. Optimum exposures are shown in Table 2.

TABLE 2

| Optimum Exposure (mJ/cm$^2$) | | | |
|---|---|---|---|
| Example 8 | Example 9 | Example 10 | Example 11 |
| 150 | 150 | <150 | <<150 |

Each of the resulting printing plates was mounted on the AB Dick press, and printed at least 250 good quality impressions.

Examples 12–16

Coating solutions containing dispersions of the components described in Table 3, in ethyl acetate/n-propanol/ethanol (86.5:16.2:1) for Examples 12 and 14 and in ethyl acetate/n-propanol/iso-propanol (86.5:16.2:1) for Examples 13, 15, and 16, were coated on an about 100 micron (4 mil) poly(ethylene terephthalate) donor support with a wire wound bar. The particles of the cyanoacrylate polymer were prepared as in Example 17. IR Dye D was applied as a dispersion. The resulting donor elements were dried at 65° C. for 60 seconds in the Ranar conveyor oven. Dry coating weight of the donor layers: 1.5 g/m$^2$.

TABLE 3

| Component | Example 12 | 13 | 14 | 15 | 16 |
|---|---|---|---|---|---|
| | Parts by Weight | | | | |
| Particles of cyanoacrylate polymer | 77.7 | 77.7 | 77.7 | 77.7 | 77.7 |
| IR Dye D | 7.3 | 7.3 | 7.3 | 7.3 | 7.3 |
| E-735 | 14.5 | | | | |
| S-630 | | 14.5 | | | |
| E-335 | | | 14.5 | | |
| I-535 | | | | 14.5 | |
| I-335 | | | | | 14.5 |
| Byk 340 | 0.5 | 0.5 | 0.5 | 0.5 | 0.5 |

Each donor element was mounted to the anodized face of the aluminum receptor, with the donor layer in contact with the anodized surface of the receptor. Adhesive, vinyl tape held the donor support firmly in position. The resulting assemblages were then imaged with a CREO® Trendsetter 3244 (laser power of 15 watts, imaging energy densities of 150, 250, 350 and 400 mJ/cm$^2$) with an internal test pattern. The imaged assemblage was removed from the Trendsetter, the tape was removed and the donor support peeled away from the aluminum receptor. The images (pale green in color) had been transferred from the donor element to the receptor.

The optimum exposure is shown in Table 4.

TABLE 4

| Optimum Exposure (mJ/cm$^2$) | | | | |
|---|---|---|---|---|
| Example 12 | Example 13 | Example 14 | Example 15 | Example 16 |
| >350 | >350 | 150 | >350 | 150 |

The resolution was at least 2–98% at 150 lines per inch for each resulting printing plate. The printing plates from Examples 14 and 16 were mounted on the AB Dick press and evaluated as in Example 1. Each printing plate printed at least 250 good quality impressions.

Example 17

This example illustrates preparation of particles of a cyanoacrylate polymer.

A flask was charged with a solution of 5.2 g of Aerosol OT in 1750 g of reagent ethyl acetate and 60 g of methyl/ethyl cyanoacrylate monomer. Polymerization was initiated by adding 20 drops of a solution of triethylamine (10 drops) in ethyl acetate (10 ml) to the stirred solution. The solution took on a bluish translucent haze. Polymerization was mildly exothermic. After about 20 minutes, another 60 g of monomer was added in three increments over about 30 minutes. The viscosity of the dispersion was higher than that of a typical latex.

It this preparation, the preferred cyanoacrylate monomer is LOCTITE® 85 (80% methyl 2-cyanoacrylate and 20% ethyl 2-cyanoacrylate). This can be replaced by (but is not the same as) a mixture of 80 parts LOCTITE® 493 (methyl-2-cyanoacrylate) and 20 parts LOCTITE® 420 (ethyl-2-cyanoacrylate).

Having described the invention, we now claim the following and their equivalents.

What is claimed is:

1. An assemblage comprising:
a donor element comprising:
a donor support,
a donor layer over the donor support, and
a photothermal conversion material; and
a receptor;
in which:
the donor layer comprises a binder and particles of a cyanoacrylate polymer;
the donor layer is in face to face contact with the receptor; and
either the donor support or the receptor transmits infrared or near infrared radiation,
wherein the binder in the donor layer is selected from the group consisting of poly(vinyl pyrrolidone), poly(vinyl alcohol), polyethyleneimine, poly(ethyloxazoline), polyacrylamide, gelatin, polyacrylic acid, polyvinylimidazole, starches, dextrin, amylogen, gum arabic, agar, algin, carrageenan, fucoidan, laminarin, corn hull gum, gum ghatti, karaya gum, locust bean gum, pectin, guar gum, hydroxypropylcellulose, hydroxypropylmethylcellulose, hydroxyethylcellulose, carboxymethyl cellulose, polyvinyl pyrrolidone/vinyl acetate copolymers, and polyvinyl pyrrolidone/vinylcaprolactam copolymers.

2. The assemblage of claim 1 in which the donor support transmits infrared or near infrared radiation.

3. The assemblage of claim 2 in which the donor layer comprises the photothermal conversion material.

4. The assemblage of claim 3 in which the donor layer comprises about 1 wt % to about 25 wt % of the photothermal conversion material; about 5 wt % to about 20 wt % of the binder; and about 60 wt % to about 90 wt % the cyanoacrylate polymer particles.

5. The assemblage of claim 4 in which the particles have a major dimension between about 50 nm and about 500 nm.

6. The assemblage of claim 5 in which the binder is selected from poly(vinyl pyrrolidone), polyvinyl pyrrolidone/vinyl acetate copolymers, and mixtures thereof.

7. The assemblage of claim 2 in which the binder is selected from poly(vinyl pyrrolidone), polyvinyl pyrrolidone/vinyl acetate copolymers, and mixtures thereof.

8. The assemblage of claim 7 in which the donor layer comprises the photothermal conversion material and the donor layer comprises about 7 wt % to about 20 wt % of the photothermal conversion material; about 10 wt % to about 18 wt % of the binder; and about 65 wt % to about 85 wt % of the cyanoacrylate polymer particles.

9. The assemblage of claim 8 in dry weight ratio of the photothermal conversion material to the particles of the cyanoacrylate polymer is from about 0.02:1 to about 0.8:1.

10. The assemblage of claim 2 in which the donor element additionally comprises an absorber layer between the donor support and the donor layer, and the absorber layer comprises the photothermal conversion material.

11. The assemblage of claim 10 in which the binder is selected from poly(vinyl pyrrolidone), polyvinyl pyrrolidone/vinyl acetate copolymers, and mixtures thereof.

12. The assemblage of claim 1 in which the receptor transmits infrared or near infrared radiation.

13. The assemblage of claim 1 in which the cyanoacrylate polymer is selected from the group consisting of poly (methyl-2-cyanoacrylate), (methyl-2-cyanoacrylate/ethyl-2-cyanoacrylate) copolymer, poly(ethoxy-2-ethyl cyanoacrylate), poly(methoxy-2-ethyl cyanoacrylate), (ethoxy-2-ethyl cyanoacrylate/methoxy-2-ethyl cyanoacrylate) copolymer, (ethyl-2-cyanoacrylate/ethoxy-2-ethyl cyanoacrylate) copolymer, (methyl-2-cyanoacrylate/methoxy-2-ethyl cyanoacrylate) copolymer, (ethyl cyanoacrylate/methoxy-2-ethyl cyanoacrylate) copolymer, (methyl cyanoacrylate/ethoxy-2-ethyl cyanoacrylate) copolymer, poly(ethyl-2-cyanoacrylate), poly(n-propyl-2-cyanoacrylate), poly(n-butyl-2-cyanoacrylate), and mixtures thereof.

14. A method for forming an image, the method comprising the steps of:
(a) thermally imaging an assemblage comprising: a donor element comprising:
a donor support,
a donor layer over the donor support, and
a photothermal conversion material; and
a receptor;
in which:
the donor layer comprises a binder and particles of a cyanoacrylate polymer;
the donor layer is in face to face contact with the receptor; and
either the donor support or the receptor transmits infrared or near infrared radiation; and (b) separating the donor element from the receptor, wherein the binder in the donor layer is selected from the group consisting of poly(vinyl pyrrolidone), poly(vinyl alcohol), polyethyleneimine, poly(ethyloxazoline), polyacrylamide, gelatin, polyacrylic acid, polyvinylimidazole, starches, dextrin, amylogen, gum arabic, agar, algin, carrageenan, fucoidan, laminarin, corn hull gum, gum ghatti, karaya gum, locust bean gum, pectin, guar gum, hydroxypropylcellulose, hydroxypropylmethylcellulose, hydroxyethylcellulose, carboxymethyl cellulose, polyvinyl pyrrolidone/vinyl acetate copolymers, and polyvinyl pyrrolidone/vinylcaprolactam copolymers.

15. The method of claim 14 in which the binder is selected from poly(vinyl pyrrolidone), polyvinyl pyrrolidone/vinyl acetate copolymers, and mixtures thereof.

16. The method of claim 14 in which imaging is carried out with a hot body.

17. The method of claim 14 in which in which the donor layer comprises the photothermal conversion material.

18. The method of claim 17 in which the receptor transmits infrared or near infrared radiation, imaging is carried out with infrared or near infrared radiation imaging radiation, and the imaging radiation is transmitted by the receptor.

19. The method of claim 17 in which the donor support transmits infrared or near infrared radiation, imaging is carried out with infrared or near infrared radiation imaging radiation, and the imaging radiation is transmitted by the donor support.

20. The method of claim 19 in which the binder is selected from poly(vinyl pyrrolidone), polyvinyl pyrrolidone/vinyl acetate copolymers, and mixtures thereof.

* * * * *